United States Patent
Ishii

[11] Patent Number: 5,977,814
[45] Date of Patent: Nov. 2, 1999

[54] DRIVING CIRCUIT FOR IGBT

[75] Inventor: Shinichi Ishii, Saitama, Japan

[73] Assignee: Fuji Electric Co., Ltd., Japan

[21] Appl. No.: 09/075,237

[22] Filed: May 8, 1998

[30]  Foreign Application Priority Data

May 8, 1997  [JP]  Japan ..................................... 9-118345

[51] Int. Cl.⁶ .......................... H03K 17/16; H03K 17/04
[52] U.S. Cl. .......................... 327/434; 327/108; 327/374
[58] Field of Search .................................. 327/108, 374, 327/376, 377, 427, 432, 434, 435, 437; 363/98

[56]  References Cited

U.S. PATENT DOCUMENTS

| | | | |
|---|---|---|---|
| 5,089,719 | 2/1992 | Kamei et al. ............................ | 327/544 |
| 5,121,283 | 6/1992 | Ibori et al. ................................ | 363/56 |
| 5,526,216 | 6/1996 | Konrad et al. ........................... | 327/310 |
| 5,530,385 | 6/1996 | Miettinen ................................ | 327/303 |
| 5,646,514 | 7/1997 | Tsunetsugu ............................... | 323/288 |
| 5,818,281 | 10/1998 | Ohura et al. ............................. | 327/381 |

*Primary Examiner*—Timothy P. Callahan
*Assistant Examiner*—Terry L. Englund
*Attorney, Agent, or Firm*—Rossi & Associates

[57]  ABSTRACT

A driving circuit for driving an IGBT includes a forward-bias power supply, a reverse-bias power supply, a forward-bias semiconductor switch, a reverse-bias semiconductor switch, a first resistor for limiting forward-bias current, and a second resistor for limiting reverse-bias current. In this driving circuit, one terminal of a capacitor is connected to a common node of the resistor for limiting forward-bias current, the resistor for limiting reverse-bias current, and a gate of the IGBT. A mode switching semiconductor switch is connected at one terminal to the other terminal of the capacitor. The other terminal of the mode switching semiconductor switch is connected to a common node of the forward-bias power supply and the reverse-bias power supply. In operation, the mode switching semiconductor switch is turned on and turned off so as to establish a given rate of change of voltage which is independently selected for turn-on and turn-off of the IGBT.

3 Claims, 4 Drawing Sheets

DRIVING CIRCUIT FOR IGBT

FIELD OF THE INVENTION

The present invention relates to a driving circuit for IGBT having a function of selecting one of a reduced dv/dt (the rate of change of voltage) mode and a high dv/dt mode (which will be also called "normal mode") upon switching of an insulated gate bipolar transistor (hereinafter abbreviated to "IGBT"), so as to reduce high-frequency leakage current.

BACKGROUND OF THE INVENTION

FIG. 7 shows a known example of the above type of driving circuit for IGBT. In FIG. 7, the driving circuit includes a power supply 1 for producing forward bias current, power supply 2 for producing reverse bias current, MOS field-effect transistor (MOSFET) 3 for forward biasing IGBT, MOSFET 4 for reverse biasing IGBT, gate resistor 5 of the forward-bias MOSFET, gate resistor 6 of the reverse-bias MOSFET, gate resistor 7 for limiting forward bias current, gate resistor 8 for limiting reverse bias current, IGBT 9, gate/emitter resistor 10 of the IGBT 9, and a drive signal input portion 11.

To turn on the IGBT 9 in the circuit as described above, an ON signal is input to the drive signal input portion 11, thereby to turn on the MOSFET 3, and a voltage is applied from the forward bias power supply 1 to the IGBT 9, through the MOSFET 3 and resistors 7, 10, so as to charge a gate capacitor (not illustrated) of the IGBT 9.

To turn off the IGBT 9, on the other hand, an OFF signal is input to the drive signal input portion 11, thereby to turn on the MOSFET 4, so that the gate capacitor of the IGBT 9 is discharged, through the MOSFET 4, resistor 8 and others.

The known driving circuit shown in FIG. 7 does not have a function of changing dv/dt of the IGBT from the outside. To change the rate of change of voltage dv/dt, therefore, it is necessary to individually control or adjust resistance values of the forward bias resistor 7 and reverse bias resistor 8 shown in FIG. 7.

It has been known in the art that the rate of change of voltage dv/dt can be changed by changing the rate or speed of charging and discharging the gate capacitor of the IGBT. Since the capacitance of this gate capacitor at the time of turn-on is different from that at the time of turn-off, the resistance values of the forward-bias resistor 7 and reverse-bias resistor 8 need to be individually adjusted in the circuit of FIG. 7 so as to deal with the difference. However, the adjustment of the resistance values requires a time-consuming, cumbersome procedure, and thus dv/dt cannot be easily changed. This also makes it difficult to reduce high-frequency leakage current.

SUMMARY OF THE INVENTION

It is therefore an object of the present invention to provide a driving circuit for IGBT wherein the rate of change of voltage dv/dt can be easily changed so as to reduce high-frequency leakage current.

To accomplish the above object, there is provided according to the present invention a driving circuit for driving an IGBT, comprising: a first power supply for producing forward-bias current, a second power supply for producing reverse-bias current, a first semiconductor switch for forward biasing the IGBT, a second semiconductor switch for reverse biasing the IGBT, a first resistor for limiting forward bias current, a second resistor for limiting reverse bias current, a capacitor having a first terminal that is connected between a common node of said first resistor for limiting forward-bias current and the second resistor for limiting reverse-bias current, and a gate of the IGBT, a mode switching semiconductor switch having a first terminal that is connected to a second terminal of the capacitor, and a second terminal that is connected to a common node of the first power supply and the second power supply. The mode switching semiconductor switch is turned on and turned off so as to establish a rate of change of voltage which is independently selected for turn-on and turn-off of the IGBT.

In one preferred form of the invention, the driving circuit further includes a third resistor connected between the first terminal of the capacitor and the gate of the IGBT. This driving circuit may further include a diode connected in parallel with the third resistor.

FIGS. 5(a) and 5(b) show an equivalent circuit of IGBT.

As shown in FIG. 5(a), the IGBT is a composite element consisting of a field-effect transistor (FET) and a transistor. More specifically, the IGBT is configured such that a drain (D) and a source (S) of the FET is connected between a base (B) and an emitter (E) of the transistor. As shown in FIG. 5(b), the FET consists of a capacitor Cg, and a current source for producing current represented by the product of mutual conductance $g_m{}^t$ and voltage $V_{gs}$ between the gate and source of the FET, and the transistor consists of a resistor having mutual conductance $g_{be}$, and a current source for producing current represented by the product of mutual conductance $g_m{}^t$ and voltage $V_{be}$ between the base and emitter of the transistor.

The turn-on and turn-off characteristics of the IGBT are determined by gate charge characteristics as shown in the graph of FIG. 6. There will be next described the manner in which dv/dt arises during turn-on and turn-off of the IGBT.

When forward-bias current is supplied to the gate of the IGBT so as to turn on the transistor, the voltage between the gate and emitter, as represented by $V_{GE}$ in FIG. 6, changes from the original point (0) to point A, and then to point B. In this process, the voltage between the collector and emitter, as represented by $V_{CE}$ in FIG. 6, changes from point E to point F. This change provides dv/dt during turn-on.

When reverse-bias current is supplied to the gate of the IGBT so as to turn off the transistor, on the other hand, the voltage $V_{GE}$ changes from point D, to point C, point B and point A in this order, and the voltage $V_{CE}$ changes from point F to point E, as shown in FIG. 6. This change provides dv/dt during turn-off. Thus, dv/dt may be reduced by lowering the rate of change of the voltage $V_{CE}$. It is to be noted that the voltage $V_{CE}$ changes substantially in synchronization with changes in the voltage $V_{GE}$.

Moreover, changes in the voltage $V_{GE}$, are determined by the manner in which the gate capacitor (Cg in FIG. 5) is charged or discharged. To change the rate of change of the voltage ($V_{GE}$), therefore, an external circuit including a capacitor and a semiconductor switch may be used for changing the time constant of charging and discharging, thereby to provide a gate driving circuit that operates in a selected one of the reduced dv/dt mode and normal mode.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Figure 1:
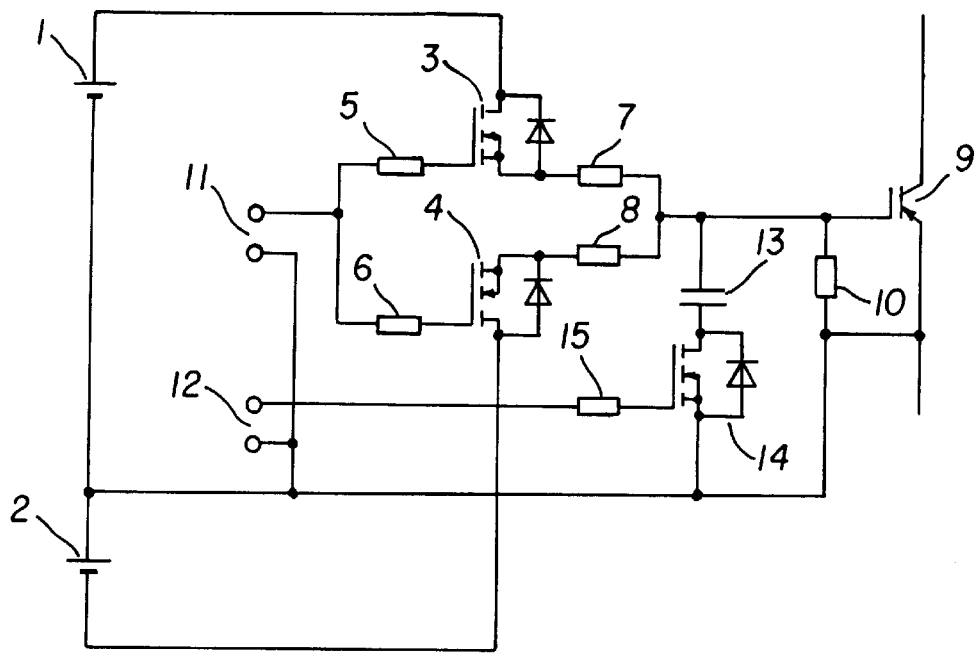
FIG. 1 is a circuit diagram showing the first embodiment of the present invention.

FIG. 1 is a circuit diagram showing the first embodiment of the present invention.

Figure 7:
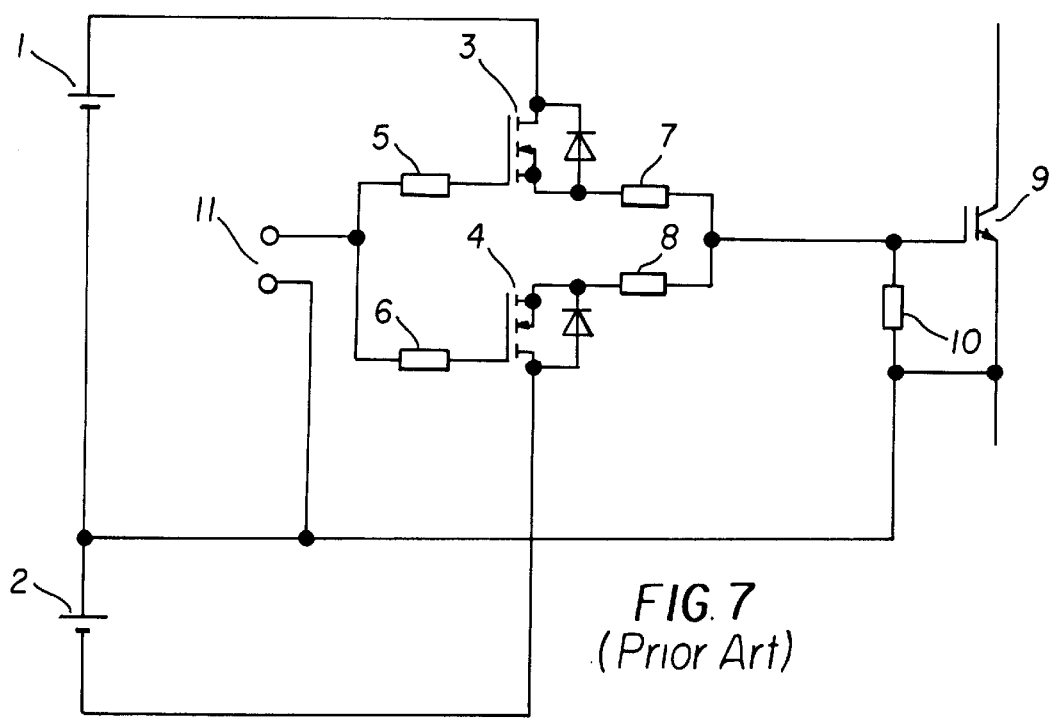
FIG. 7 is a circuit diagram showing a known example of IGBT driving circuit.

As is apparent from FIG. 1, the driving circuit for IGBT according to the present invention is obtained by adding a mode switching signal input portion 12, capacitor 13, mode switching MOSFET 14, and a gate resistor 15 of the mode switching MOSFET 14, to the known circuit as shown in FIG. 7. More specifically, one terminal of the capacitor 13 is connected between a common point or node of the forward-bias gate resistor 7 and reverse-bias gate resistor 8, and a connection point with the gate resistor of the IGBT, and the other terminal of the capacitor 13 is connected to one terminal of the mode switching MOSFET 14. The other terminal of the mode switching MOSFET 14 is connected to a common point or node of the forward-bias power supply 1 and the reverse-bias power supply 2. The MOSFET 14 for switching the mode may be replaced by other type of semiconductor switch.

Figure 5A:
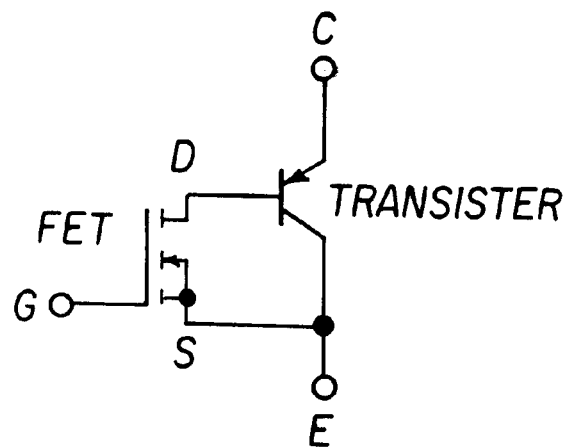
FIG. 5 is a circuit diagram showing an equivalent circuit of IGBT.
Figure 5B:
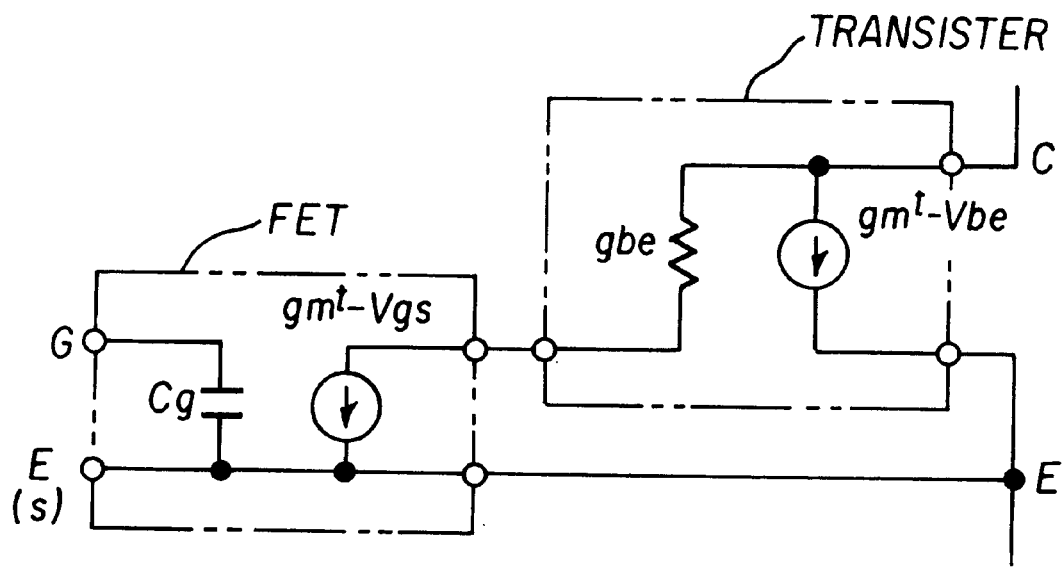

In the above arrangement, the IGBT driving circuit operates in the same manner as in the known example of FIG. 7 when the mode switching MOSFET 14 is in the OFF state. When a certain signal is input to the mode switching signal input portion 12, to turn on the MOSFET 14, the capacitor 13 is connected in parallel with the capacitor Cg (as shown in FIG. 5(b)) located between the gate and emitter of the IGBT 9, whereby the time constant (T=CR) of gate charging and discharging during turn-on/turn-off of the IGBT 9 can be changed (namely, the time constant can be made larger than that of the known example shown in FIG. 7). As a result, the rate of change of voltage dv/dt during turn-on/turn-off of the IGBT 9 can be changed. Thus, the IGBT 9 is able to operate in a selected one of the high dv/dt mode (normal mode) and reduced dv/dt mode.

Figure 2:
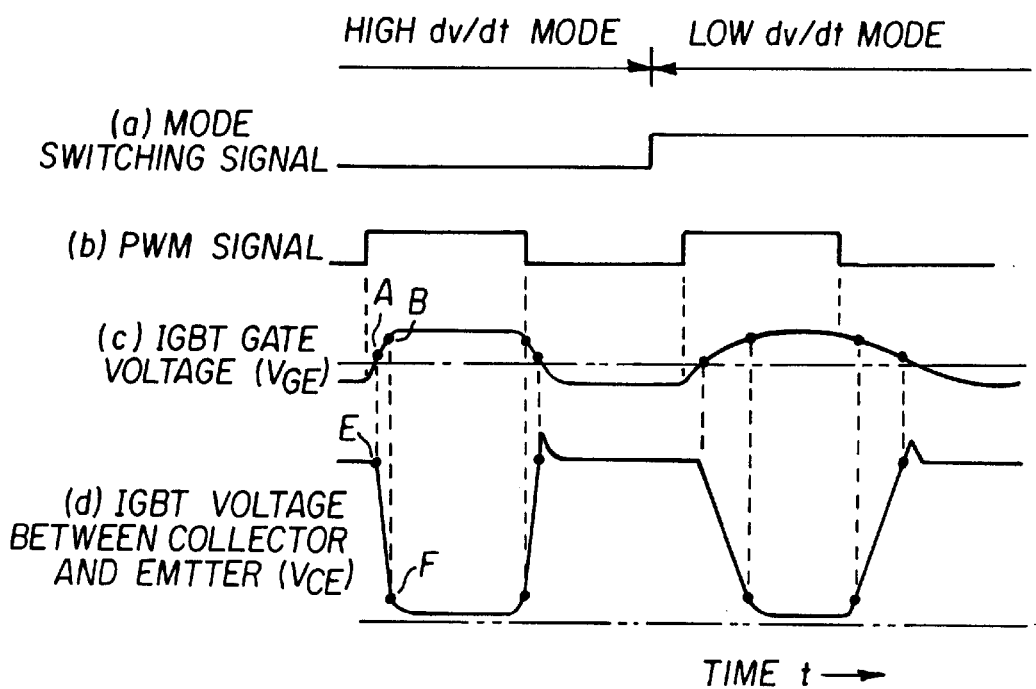
FIG. 2 is a view explaining the operation of the embodiment of FIG. 1.

The operation of the circuit of FIG. 1 will be now explained with reference to FIG. 2.

Figure 6:
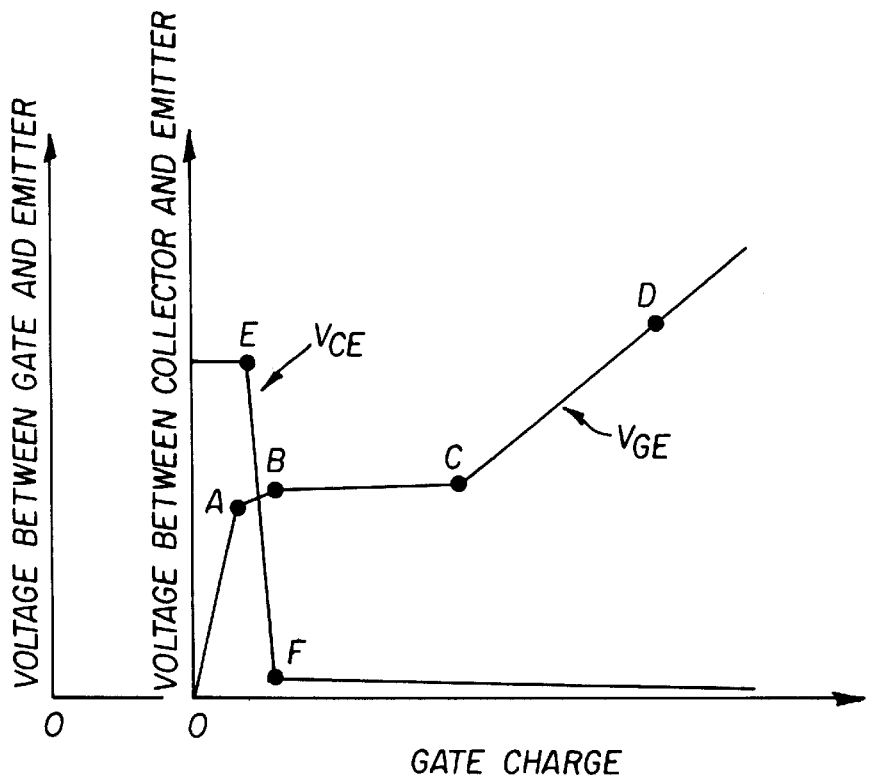
FIG. 6 is a graph for explaining gate charge characteristics of IGBT.

When a mode switching signal representing the high dv/dt mode as shown in FIG. 2(a) is applied to the mode switching signal input portion 12, so as to establish the high dv/dt mode, and an ON signal in the form of PWM signal as shown in FIG. 2(b) is applied to the drive signal input portion 11, so as to turn on the IGBT, the gate voltage $V_{GE}$ of the IGBT 9 is increased with a time-log of first order, as shown in FIG. 2(c). In this process, if the gate voltage $V_{GE}$ changes from point A to point B, the voltage $V_{CE}$ between the collector and emitter of IGBT as shown in FIG. 2(d) changes from point E to point F as explained above with reference to FIG. 6. The amount of change in the voltage $V_{CE}$ between point E and point F is divided by the time required for the change, to thus provide dv/dt during turn-on of the IGBT.

If an OFF signal in the form of PWM signal is applied so as to turn off the IGBT 9 after a certain signal is applied to establish the low dv/dt mode, the gate voltage $V_{GE}$ is reduced with a time-log of first order, as shown in FIG. 2(c). In this process, if the gate voltage $V_{CE}$ changes from point B to point A, the voltage $V_{CE}$ changes from point F to point E as explained above with reference to FIG. 6. The amount of change in the voltage $V_{CE}$ between point E and point F is divided by the time required for the change, to thus provide dv/dt during turn-on of the IGBT.

Figure 3:
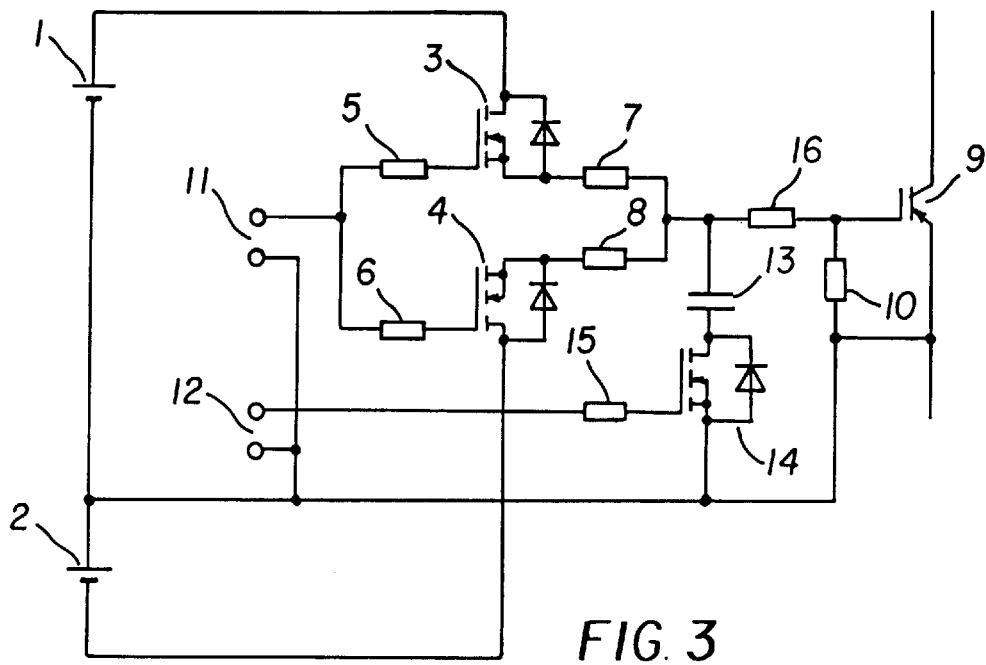
FIG. 3 is a circuit diagram showing the second embodiment of the present invention.

FIG. 3 is a circuit diagram showing the second embodiment of the present invention.

The second embodiment is different from the first embodiment of FIG. 1 in that another resistor 16 is connected between one terminal of the capacitor 13 and the gate/emitter resistor 10 of the IGBT 9. With this arrangement, the time constant of charging and discharging during turn-on/turn-off of the IGBT 9 can be changed as desired.

Figure 4:
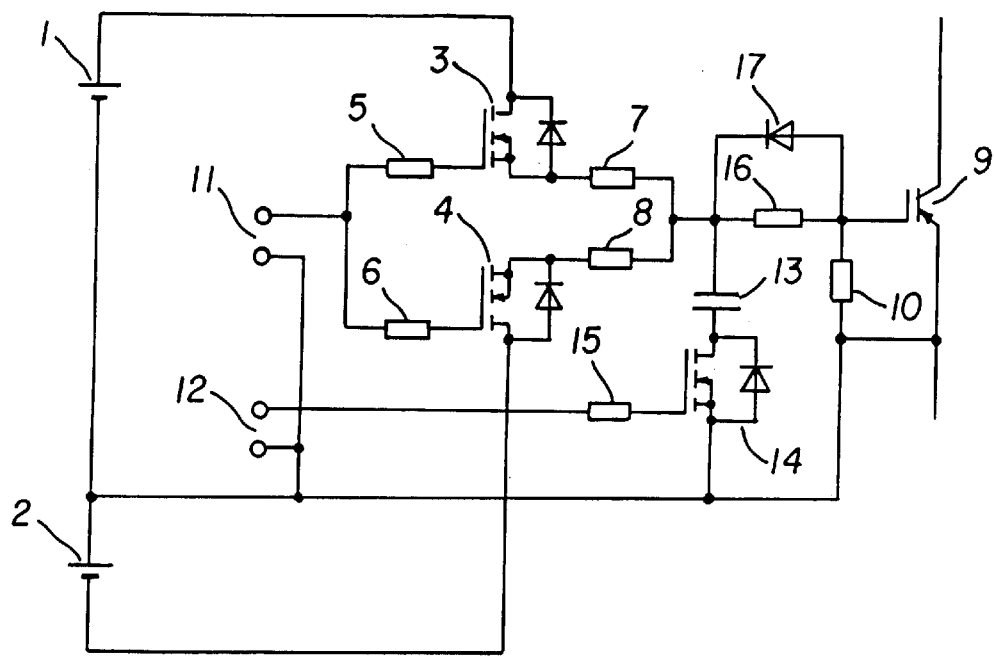
FIG. 4 is a circuit diagram showing the third embodiment of the present invention.

FIG. 4 is a circuit diagram showing the third embodiment of the present invention.

This embodiment is a modified example of the second embodiment of FIG. 3, and is different from the second embodiment in that a diode 17 is connected in parallel with the gate resistor 16. With this arrangement, the time constant of charging and discharging during turn-on/turn-off can be changed to a greater extent as compared with the embodiment of FIG. 3, because during turn-off, in particular, the current can bypass the resistor 16 in the presence of the diode 17. In this case, the rate of change of voltage dv/dt during turn-on/turn-off may be selected from a broader range, namely, the range of setting of dv/dt can be broadened.

According to the present invention, the time constant of gate charging and discharging of IGBT can be changed to a suitable value by means of a switch, and therefore the IGBT driving circuit can be easily switched between the reduced dv/dt mode and the normal mode.

What is claimed is:

1. A driving circuit for driving an IGBT, comprising:
   a first power supply for producing forward-bias current;
   a second power supply for producing reverse-bias current;
   a first semiconductor switch, for supplying the forward-bias current to the IGBT, coupled to the first power supply and a first resistor for limiting the forward-bias current;
   a second semiconductor switch, for supplying the reverse-bias current to the IGBT, coupled to the second power supply and a second resistor for limiting the reverse-bias current;
   a capacitor having a first terminal that is connected to a common node of said first resistor, the second resistor, and a gate of the IGBT; and
   a mode switching semiconductor switch having a first terminal that is connected to a second terminal of said capacitor, and a second terminal that is connected to a common node of said first power supply and said second power supply, said mode switching semiconductor switch being turned on and turned off so as to establish a rate of change of voltage which is independently selected for turn-on and turn-off of the IGBT.

2. A driving circuit according to claim 1, further comprising a third resistor connected between said first terminal of said capacitor and the gate of the IGBT.

3. A driving circuit according to claim 2, further comprising a diode connected in parallel with said third resistor.

* * * * *